(12) United States Patent
Hayashi et al.

(10) Patent No.: US 9,076,969 B2
(45) Date of Patent: Jul. 7, 2015

(54) PIEZOELECTRIC MATERIAL, PIEZOELECTRIC ELEMENT, LIQUID DISCHARGE HEAD, ULTRASONIC MOTOR, AND DUST CLEANING DEVICE

(75) Inventors: Jumpei Hayashi, Chofu (JP); Takanori Matsuda, Chofu (JP); Takayuki Watanabe, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 179 days.

(21) Appl. No.: 13/702,998

(22) PCT Filed: Jun. 7, 2011

(86) PCT No.: PCT/JP2011/063623
§ 371 (c)(1),
(2), (4) Date: Dec. 7, 2012

(87) PCT Pub. No.: WO2011/155634
PCT Pub. Date: Dec. 15, 2011

(65) Prior Publication Data
US 2013/0088120 A1    Apr. 11, 2013

(30) Foreign Application Priority Data

Jun. 10, 2010 (JP) ................................ 2010-133291
May 24, 2011 (JP) ................................ 2011-115837

(51) Int. Cl.
*H01L 41/187* (2006.01)
*B08B 7/02* (2006.01)
(Continued)

(52) U.S. Cl.
CPC ............ *H01L 41/1878* (2013.01); *B08B 7/026* (2013.01); *B41J 2/14233* (2013.01);
(Continued)

(58) Field of Classification Search
USPC .......................... 310/358, 311, 357, 363–365; 252/62.9 PZ, 62.9 R; 501/134, 135
See application file for complete search history.

(56) References Cited

U.S. PATENT DOCUMENTS 5,684,612 A    11/1997  Wilde
2007/0120164 A1    5/2007  Fukui
(Continued)

FOREIGN PATENT DOCUMENTS

CN    1812128 A    8/2006
CN    101575213 A    11/2009
(Continued)

OTHER PUBLICATIONS

Takuro Ikeda et al., "Some Compounds of Tungsten-Bronze Type A6B10O30 (B=Nb, Ti or Nb, W)", Japanese Journal of Applied Physics, Aug. 1971, pp. 987-994, vol. 10, No. 8.
(Continued)

*Primary Examiner* — Thomas Dougherty
*Assistant Examiner* — Karen B Addison
(74) *Attorney, Agent, or Firm* — Canon USA Inc. IP Division

(57) ABSTRACT

A piezoelectric material including a barium bismuth niobate-based tungsten bronze structure metal oxide having a high degree of orientation is provided. A piezoelectric element, a liquid discharge head, an ultrasonic motor, and a dust cleaning device including the piezoelectric material are also provided. A piezoelectric material includes a tungsten bronze structure metal oxide that includes metal elements which are barium, bismuth, and niobium, and tungsten. The metal elements satisfy following conditions on a molar basis: when Ba/Nb=a, $0.30 \leq a \leq 0.40$, and when Bi/Nb=b, $0.012 \leq b \leq 0.084$. The tungsten content on a metal basis is 0.40 to 3.00 parts by weight relative to 100 parts by weight of the tungsten bronze structure metal oxide. The tungsten bronze structure metal oxide has a c-axis orientation.

13 Claims, 5 Drawing Sheets

(51) Int. Cl.
*B41J 2/14* (2006.01)
*C01G 33/00* (2006.01)
*C04B 35/495* (2006.01)
*H01L 41/43* (2013.01)
*H02N 2/10* (2006.01)
*H02N 2/16* (2006.01)
*H01L 41/18* (2006.01)

(52) U.S. Cl.
CPC ........... B41J2202/03 (2013.01); C01G 33/006 (2013.01); *C01P 2002/52* (2013.01); *C01P 2002/72* (2013.01); *C01P 2006/40* (2013.01); C04B 35/495 (2013.01); *C04B 2235/3201* (2013.01); *C04B 2235/3213* (2013.01); *C04B 2235/3215* (2013.01); *C04B 2235/3251* (2013.01); *C04B 2235/3258* (2013.01); *C04B 2235/3262* (2013.01); *C04B 2235/3298* (2013.01); *C04B 2235/6027* (2013.01); *C04B 2235/605* (2013.01); *C04B 2235/76* (2013.01); *C04B 2235/787* (2013.01); *C04B 2235/81* (2013.01); H01L 41/1871 (2013.01); H01L 41/43 (2013.01); H02N 2/106 (2013.01); H02N 2/163 (2013.01); H01L 41/18 (2013.01)

(56) References Cited

U.S. PATENT DOCUMENTS

| | | |
|---|---|---|
| 2008/0067898 A1 | 3/2008 | Aoki |
| 2010/0025618 A1* | 2/2010 | Watanabe et al. ........ 252/62.9 R |
| 2013/0076204 A1* | 3/2013 | Matsuda et al. .............. 310/311 |
| 2013/0088119 A1 | 4/2013 | Hayashi |
| 2013/0088120 A1* | 4/2013 | Hayashi et al. .............. 310/311 |

FOREIGN PATENT DOCUMENTS

| | | |
|---|---|---|
| DE | 102006008742 A | 8/2007 |
| JP | 2000-169229 A | 6/2000 |
| JP | 2001-72466 A | 3/2001 |
| JP | 2002-29368 A | 10/2002 |
| JP | 2003-261379 A | 9/2003 |
| JP | 2006-182643 A | 7/2006 |
| JP | 2008-208004 A | 9/2008 |
| WO | 2010/125987 A1 | 11/2010 |
| WO | 2011/010566 | 1/2011 |

OTHER PUBLICATIONS

Fang Liang et al., "Structural and Dielectric Properties of a Niobate Ba3NaBiNb10O30", Wuli Huaxue Xuebao, May 30, 2001, pp. 457-459, vol. 17, No. 5, China Academic Journal Electronic Publishing House.

Japanese Journal of Applied Physics, 2008, vol. 47, No. 9, pp. 7693-7697.

Japanese Journal of Applied Physics, 2008, vol. 47, No. 5, pp. 4242-4247.

Neurgaonkar et al., "Growth and Ferroelectric Properties of Tungsten Bronze Sr2—xCaNb5O15 Single Crystals", Materials Research Bulletin, Oct. 31, 1988, pp. 1459-1467, vol. 23, No. 10.

Ferroelectric Properties of Tungsten Bronze Morphotropic Phase Boundary Systems.

* cited by examiner

PIEZOELECTRIC MATERIAL, PIEZOELECTRIC ELEMENT, LIQUID DISCHARGE HEAD, ULTRASONIC MOTOR, AND DUST CLEANING DEVICE

TECHNICAL FIELD

The present invention relates to piezoelectric materials. In particular, it relates to a lead-free piezoelectric material. It also relates to a piezoelectric element, a liquid discharge head, an ultrasonic motor, and a dust cleaning device that use the lead-free piezoelectric material.

BACKGROUND ART

Lead zirconate titanate that contains lead is a piezoelectric material most widely used in various piezoelectric devices. Attempts have been made to replace lead-containing piezoelectric materials by lead-free piezoelectric materials. This is to address the concern that lead-containing piezoelectric devices once discarded and exposed to acid rain may inflict damage on ecosystem as the lead component in the piezoelectric materials may leach into earth. Thus, various proposals of piezoelectric material have been made.

One example of the lead-free piezoelectric material is a tungsten bronze structure material containing, for example, barium bismuth niobate as a main component. PTL 1 discloses a material system that contains barium lithium niobate as a main component and bismuth niobate as an accessory component. However, since the unit cell of crystals having a tungsten bronze structure has a high shape anisotropy, the polar axis direction lies only in the c-axis direction, i.e., the short side direction of the unit cell. Accordingly, there have been fewer effective domains that can contribute to piezoelectricity and the piezoelectric properties have been unsatisfactory.

Another approach to enhancing the properties of a lead-free piezoelectric material having a tungsten bronze structure is to orient the piezoelectric material by using a magnetic field (magnetic orientation). Magnetic orientation can increase the number of effective magnetic domains that contribute to piezoelectricity. PTL 2 discloses a technique of using anisotropic particles as the starting material to improve the degree of orientation in conducting magnetic orientation. However, this technique is applicable only to piezoelectric materials that have a composition that can use anisotropic particles as the starting material. Thus, it has been difficult to obtain an oriented barium bismuth niobate-based material having good properties.

The present invention provide a lead-free piezoelectric material including a barium bismuth niobate-based tungsten bronze structure metal oxide having a high degree of orientation. A piezoelectric element, a liquid discharge head, an ultrasonic motor, and a dust cleaning device that include the piezoelectric material are also provided.

CITATION LIST

Patent Literature

PTL 1 Japanese Patent Laid-Open No. 2001-72466
PTL 2 Japanese Patent Laid-Open No. 2008-208004

SUMMARY OF INVENTION

The present invention provides a piezoelectric material that includes a tungsten bronze structure metal oxide that includes metal elements which are barium, bismuth, and niobium, and tungsten. The metal elements satisfy following conditions on a molar basis:

when Ba/Nb=$a$, $0.30 \leq a \leq 0.40$, and when Bi/Nb=$b$, $0.012 \leq b \leq 0.084$.

The tungsten content on a metal basis is 0.40 to 3.00 parts by weight relative to 100 parts by weight of the tungsten bronze structure metal oxide. The tungsten bronze structure metal oxide has a c-axis orientation.

The present invention also provides a piezoelectric element that includes a first electrode, a piezoelectric material, and a second electrode. The present invention also provides a liquid discharge head, an ultrasonic motor, and a dust cleaning device that include this piezoelectric element.

The present invention can provide a piezoelectric material including a barium bismuth niobate-based tungsten bronze structure metal oxide having a high degree of orientation. Since the piezoelectric material is lead-free, the impact on the ecosystem is low. A piezoelectric element, a liquid discharge head, an ultrasonic motor, and a dust cleaning device that have high durability can also be provided.

DESCRIPTION OF EMBODIMENTS

Figure 1A:
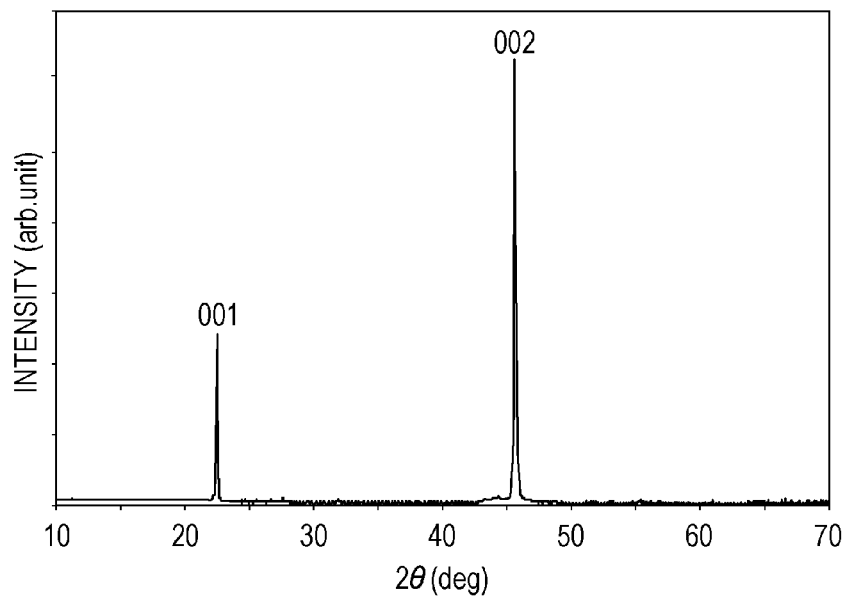
FIGS. 1A and 1B are diffraction patterns of piezoelectric materials taken by X-ray diffraction analysis in a 2θ-θ mode.

Embodiments of the present invention will now be described.

A piezoelectric material according to an embodiment includes a tungsten bronze structure metal oxide that contains metal elements, Ba, Bi, and Nb that satisfy conditions below on a molar basis, and tungsten (W):

when Ba/Nb=$a$, $0.30 \leq a \leq 0.40$, and when Bi/Nb=$b$, $0.012 \leq b \leq 0.084$.

The tungsten (W) content on a metal basis is 0.40 to 3.00 parts by weight relative to 100 parts by weight of the tungsten bronze structure metal oxide. The tungsten bronze structure metal oxide has a c-axis orientation.

In the present invention, the term "tungsten bronze structure" refers to what is generally known as tetragonal tungsten bronze (TTB) structure, and not $H_xWO_3$ (tungsten bronze) or a hexagonal tungsten bronze (HTB) structure known for its electrochromic phenomena.

The piezoelectric material has a tungsten bronze structure and contains Ba, Bi, and Nb. It is considered that Ba and Bi occupy A sites and Nb occupies B sites. When a tungsten bronze structure is constituted by Ba, Bi, and Nb, a high mechanical quality factor and high piezoelectricity can be achieved. That the piezoelectric material has a tungsten bronze structure can be confirmed by, for example, X-ray diffraction analysis. A diffraction pattern of a tungsten bronze structure measured in a 2θ-θ mode has a peak attributable to (001) plane near 2θ=22.5°, a peak attributable to (211) plane near 2θ=32.1°, and a peak attributable to (002) plane near 2θ=46.2°.

The phrase "on a molar basis" means that the amounts of the elements, such as Ba, Bi, and Nb, contained in the tungsten bronze structure determined by X-ray fluorescence analysis, inductively coupled plasma (ICP) atomic emission spectroscopy, atomic absorption spectrometry, or the like are converted to ratios in terms of moles.

The ratio a of Ba to Nb on a molar basis is 0.30≤a≤0.40. When the ratio a is less than 0.30, the curie temperature is lowered and the piezoelectric material may not function at room temperature. When the ratio a is greater than 0.40, the piezoelectric property is degraded.

The ratio b of Bi to Nb on a molar basis is 0.012≤b≤0.084. When the ratio b is greater than 0.084, the curie temperature is lowered and the piezoelectric material may not function at room temperature. When the ratio b is less than 0.012, the piezoelectric property may be lowered.

The W content "on a metal basis" is determined by measuring the contents of metals, such as Ba, Bi, Nb, and W from the tungsten bronze structure metal oxide by X-ray fluorescence analysis, ICP atomic emission spectroscopy, atomic absorption spectrometry, or the like, converting the measured contents of the elements, such as Ba, Bi, and Nb, constituting the tungsten bronze structure into oxide-based values, and determining the ratio of the weight of tungsten (W) relative to the total of the converted metal contents.

Three axes that extend along the sides of the unit cell constituting a crystal are referred to as a-axis, b-axis, and c-axis. In general, a tungsten bronze structure has a cuboidal unit cell and the three axes intersect one another perpendicularly. The length of each axis is referred to as "axis length". The c-axis length of the tungsten bronze structure is as short as about one third of the a-axis length or the b-axis length. In this specification, the term "(001) plane" refers to a plane to which the c-axis is normal.

In this specification, "orient" means that all or part of subject crystal faces are oriented in a particular direction. The "degree of orientation" indicates the degree at which the crystal faces are oriented. The degree of orientation increases when there are more portions where subject crystals faces are oriented in a particular direction. The term "c-axis orientation" means that crystal faces that lie in the c-axis direction are oriented, i.e., (001) planes are oriented. In other words, the "c-axis orientation" and the "(001) plane orientation" have the same meaning. The pole axis direction, which is the function-occurring axis of a tungsten bronze structure as a piezoelectric material, is the c-axis direction. The piezoelectric property of a tungsten bronze structure metal oxide is enhanced when c-axis orientation is achieved.

In general, a tungsten bronze structure metal oxide is expressed by a chemical formula, $A_{4\text{-}6}B_{10}O_{30}$. In the chemical formula, A indicates elements that occupy A sites. A1 sites (12-coordinated box-shaped sites when viewed in the c-axis direction) and A2 sites (15-coordinated pentagonal sites when viewed in the c-axis direction) are not distinguished. Ba and Bi primarily occupy one of two specific positions called A1 sites and A2 sites that exist around the oxygen octahedron. The maximum value of the sum of the numbers of A1 sites and A2 sites is 6.

In the chemical formula above, B indicates elements that occupy B sites. Pentavalent elements primarily occupy the B sites. In this invention, B is primarily Nb and exists inside the oxygen octahedron.

In the present invention, tungsten (W) sometimes occupies some of the B sites but this is not essential. The form in which W is contained may be an oxide, a metal, or a metal ion.

When W is contained in the piezoelectric material, the dielectric constant of the tungsten bronze structure metal oxide increases and the piezoelectric constant increases along with this. Incorporation of W also enhances the anisotropic energy of magnetic susceptibility and improves the degree of orientation when a magnetic field is applied. This is presumably due to the following reason. That is, when W replaces some of the Nb atoms in the B sites, the magnetic susceptibility or the magnetic moment in all directions of the unit cell undergo change. As a result, the anisotropy is enhanced by the difference in magnetic susceptibility among different directions of the unit cell. This phenomenon is presumably caused by the fact that the ionic radius (0.062 nm) of a hexavalent W ion is close to the ionic radius (0.069 nm) of Nb. In other words, incorporation of W brings two effects: increasing the dielectric constant and improving the magnetic susceptibility. Since the piezoelectric material has a high degree of c-axis orientation, the piezoelectric constant thereof increases significantly.

The W content on a metal basis is 0.40 to 3.00 parts by weight relative to 100 parts by weight of the tungsten bronze structure metal oxide. At a W content more than 3.00 parts by weight, the curie temperature may drop significantly. If the curie temperature is low, polarization treatment becomes difficult and the inherent piezoelectric properties of the piezoelectric material may not be fully exhibited. At a W content less than 0.40 parts by weight, the properties may not change much compared to when no W is contained. The W content is preferably 0.40 to 2.40 parts by weight and more preferably 1.20 to 2.40 parts by weight.

The Lotgering factor F of the piezoelectric material may be 0.56 to 1.00. A Lotgering factor is an indicator of the degree of c-axis (or (001)) orientation of the tungsten bronze structure metal oxide determined by X-ray diffraction analysis.

Although there are several indicators of the degree of orientation, a Lotgering factor F is used in this specification to indicate the degree of orientation. A Lotgering factor F larger than 0 indicates that the subject crystal faces are oriented.

When the Lotgering factor F is less than 0.56, there are fewer effective domains that can contribute to piezoelectricity and the piezoelectric properties are not sufficient. As the Lotgering factor F approaches 1, more effective domains that can contribute to piezoelectricity are generated and thus the piezoelectric constant is increased. When the Lotgering factor F is 1, the only peak detected is the diffraction peak attributable to the subject crystal plane. In other words, all crystals detectable by X-ray diffraction analysis are aligned and oriented in the subject direction.

The Lotgering factor F is calculated by 2θ-θ X-ray diffraction analysis. It is calculated using equation 1 below by using the cumulative peak intensity of X rays diffracted by the target crystal plane at 2θ in the range of 10° to 70°:

$$F=(\rho-\rho_0)/(1-\rho_0) \quad \text{(Equation 1)}$$

In equation 1, in the case of c-axis orientation, $\rho_0$ is determined by using the X-ray diffraction intensity ($I_0$) of a randomly oriented sample and calculated from equation (2) below as the ratio of the total of the diffraction intensities of the (001) plane (all faces perpendicular to the c-axis, l=1 or 2) to the total diffraction intensity:

$$\rho_0=\Sigma I_0(001)/\Sigma I_0(hkl) \quad \text{(Equation 2)}$$

In equation 1, in case of the c-axis orientation, ρ is determined by using the X-ray diffraction intensity (I) of an oriented sample and calculated from equation (3) below as the ratio of the total of the diffraction intensities of the (001) plane to the total diffraction intensity as with equation (2) above:

$$\rho p = \Sigma I(001)/\Sigma I(hkl) \quad \text{(Equation 3)}$$

The tungsten bronze structure metal oxide of the piezoelectric material may contain metal elements which are Ba, Bi, Nb, and Na that satisfy the following requirements:

when Ba/Nb=a, 0.30≤a≤0.40, when Bi/Nb=b, 0.012≤b≤0.084, when Na/Nb=c, 0.012≤c≤0.075, and when Bi/Na=d, 0.90≤d≤1.1.

The molar ratio a of Ba to Nb is 0.30≤a≤0.40. When the ratio a is less than 0.30, the curie temperature is low and the piezoelectric material may not function at room temperature. When the ratio a is greater than 0.40, the piezoelectric property may be lowered.

The molar ratio b of Bi to Nb is 0.012≤b≤0.084. When the ratio b is greater than 0.084, the curie temperature is low and the piezoelectric material may not function at room temperature. When the ratio b is less than 0.012, the piezoelectric property may be lowered.

The molar ratio c of Na to Nb is 0.012≤c≤0.075. When the ratio c is larger than 0.075, the curie temperature is low and the piezoelectric material may not function at room temperature. When the ratio c is less than 0.012, the piezoelectric property may be lowered.

The molar ratio d of Bi to Na is 0.90≤d≤1.1. The ideal value of the ratio d is d=1.00. When the ratio Bi to Na deviates from 1, the excess component may segregate in crystal grain boundaries or the deficient component may form defects and thus oxygen vacancies. Thus, the insulating property and the piezoelectric property may be adversely affected. It is considered that Ba, Bi, and Na occupy the A sites and Nb occupies the B sites of the tungsten bronze structure metal oxide. Since high piezoelectricity is achieved by the effect brought by combination of Bi and Na, the tungsten bronze structure metal oxide is suitable as a piezoelectric material according to an embodiment of the present invention.

The tungsten bronze structure metal oxide contained in the piezoelectric material may be represented by $(Ba_e,Ca_f,Bi_g,Na_h)_5Nb_{10}O_{30}$ (0.60≤e≤0.80, 0≤f≤0.25, 0.012≤g≤0.15, 0.012≤h≤0.15, and e+f+g+h=1.00).

The molar ratio e of Ba occupying the A sites is 0.60≤e≤0.80. When the molar ratio e is less than 0.60, the curie temperature is low and the piezoelectric material may not function at room temperature. When the molar ratio e is greater than 0.80, the tungsten bronze structure single phase may not be formed. That the piezoelectric material has a tungsten bronze structure single phase can be confirmed by X-ray diffraction analysis, for example.

The molar ratio f of Ca occupying the A sites is 0≤f≤0.25. When the tungsten bronze structure metal oxide contains Ca, the mechanical quality factor is improved. When the molar ratio f is greater than 0.25, abnormal grain growth may occur during sintering. A sintered material that has undergone abnormal grain growth is susceptible to cracking and breaking, has a low fracture strength, and thus is not suitable for use in devices.

The molar ratio g of Bi occupying the A sites is 0.012≤g≤0.15. When the ratio g is greater than 0.15, the curie temperature is low and the piezoelectric material may not function at room temperature. When the molar ratio g is less than 0.012, the piezoelectric property may be low.

The molar ratio h of Na occupying the A sites is 0.012≤h≤0.15. When the molar ratio h is greater than 0.15, the curie temperature is low and the piezoelectric material may not function at room temperature. When the ratio h is less than 0.012, the piezoelectric property may be low. However, as long as the piezoelectric property remains in the range suitable for practical application, a piezoelectric material having a molar ratio h less than 0.012 may be used.

The tungsten bronze structure metal oxide contained in the piezoelectric material may be represented by $(Ba_{1-x},Bi_{2x/3})_5Nb_{10}O_{30}$ (0.20≤x≤0.25).

The molar ratio x of Bi occupying the A sites is 0.20≤x≤0.25. When the molar ratio x is less than 0.20, the piezoelectric property may be lowered. When the molar ratio x is greater than 0.25, the curie temperature is low, and the piezoelectric material may not function at room temperature.

The piezoelectric material may further contain manganese (Mn). The Mn content on a metal basis may be 0.16 to 0.48 parts by weight relative to 100 parts by weight of the tungsten bronze structure metal oxide.

Since the piezoelectric material contains Mn, the mechanical quality factor can be improved without degrading the Lotgering factor F. The Mn content is 0.16 to 0.48 parts by weight. When the Mn content is less than 0.16 parts by weight, the properties may not change much compared to when no Mn is contained. When the Mn content exceeds 0.48 parts by weight, the piezoelectric properties may deteriorate and non-tungsten bronze structure phases may occur. The Mn content may be 0.16 to 0.32 parts by weight. The mechanical quality factor Qm is a factor that indicates elastic loss caused by vibration when the piezoelectric material is evaluated as a vibrator. When the magnitude of the mechanical quality factor is electrically measured, the mechanical quality factor is observed as the sharpness of a resonance curve. In other words, the mechanical quality factor is a factor that indicates the sharpness of the resonance of a vibrator.

The region of the piezoelectric material in which Mn exists is not limited. Manganese may occupy the sites or lie in grain boundaries without occupying the sites. The form of incorporation of Mn may be any of metal, oxide, and metal ion. When Mn is incorporated in form of metal ion, the valence may be 2, 3, 4, or 6.

Sr and Mg may occupy the A sites of the tungsten bronze structure metal oxide and elements other than Nb may occupy the B sites of the tungsten bronze structure metal oxide to facilitate production of the piezoelectric material or adjust the physical properties of the piezoelectric material. Examples of elements to be contained in the B sites include not only pentavalent metal elements such as Ta and V but also trivalent and tetravalent metal elements, more specifically, Fe, Al, Ti, and Zr. The content of these elements to be contained in the B sites is preferably 20 mol % or less and more preferably 5 mol % or less of all B-site elements. The decrease in total valence of the B-site elements may be compensated by increasing the amount of the A-site elements.

Elements such as Cu, Zn, and Co may be added to the piezoelectric material to facilitate production of the piezoelectric material and adjust the physical properties of the piezoelectric material. The amount of such additional element may be 5 parts by weight or less relative to 100 parts by weight of the tungsten bronze structure metal oxide. When more than 5 parts by weight of such elements are added, structures other than the tungsten bronze structure may occur and the insulating property may decrease.

The metal elements that occupy the respective sites of the piezoelectric material can be identified by, for example, a Rietveld method. According to the Rietveld method, not only the type of metal that occupies the sites but also the ratio thereof can be identified.

The method for preparing the piezoelectric material is not particularly limited. The piezoelectric material may be prepared by a common method of sintering a powder obtained by using raw materials, such as oxides, nitrates, and oxalates of the metals constituting the piezoelectric material or a molded body prepared by slip casting, the sintering being performed under a normal pressure. Examples of other techniques that can be employed include electric heating, microwave sintering, millimeter wave sintering, and hot isostatic pressing. From the viewpoint of suitability to magnetic orientation, a technique of sintering, under a normal pressure, a molded body formed by slip-casting a slurry may be employed.

The method for orienting the piezoelectric material is not limited to a particular method. For example, a grain orientation method using a doctor blade or a magnetic orientation method that uses a high magnetic field may be employed. A magnetic orientation method is preferred since a molded body having a c-axis orientation can be easily obtained. A magnetic orientation that uses a rotating magnetic field is more preferable.

The method for adding W, Mn, etc., to the tungsten bronze structure metal oxide is not particularly limited. For example, W may be added after the elements constituting the tungsten bronze structure metal oxide are mixed, calcined, and reacted. Alternatively, W may be mixed with the elements constituting the tungsten bronze structure metal oxide, and calcined and reacted simultaneously.

Figure 2:
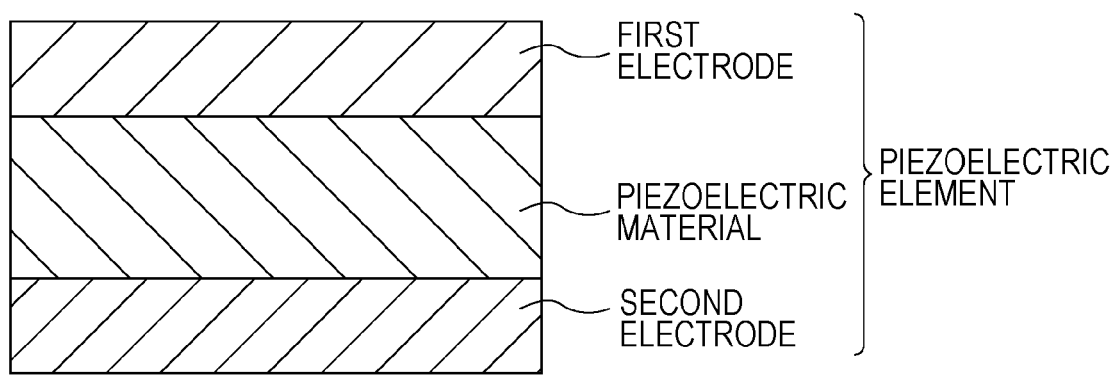
FIG. 2 is a schematic view of a piezoelectric element according to an embodiment.

FIG. 2 is a schematic view of a piezoelectric element according to an embodiment. The piezoelectric element of this embodiment includes a piezoelectric material, and a first electrode and a second electrode disposed on the piezoelectric material. The first and second electrodes may be disposed on one surface of the piezoelectric material or on opposing surfaces of the piezoelectric material so as to sandwich the piezoelectric material.

Figure 3A:
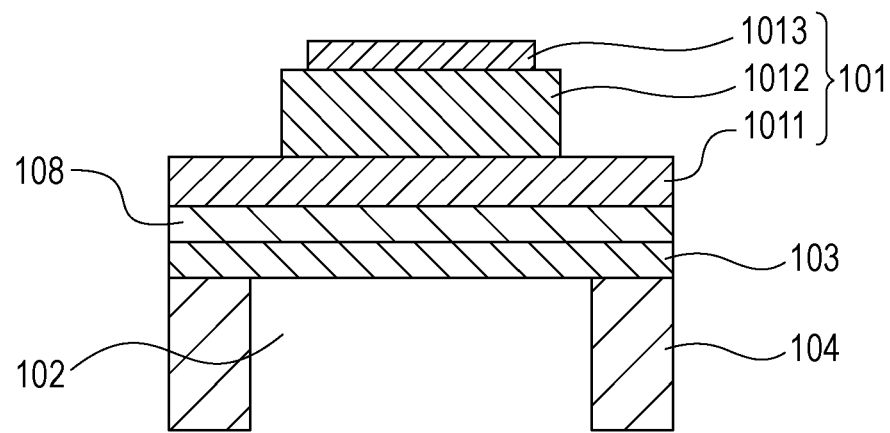
FIG. 3A and FIG. 3B are schematic diagrams showing one example of a liquid discharge head according to an embodiment.
Figure 3B:
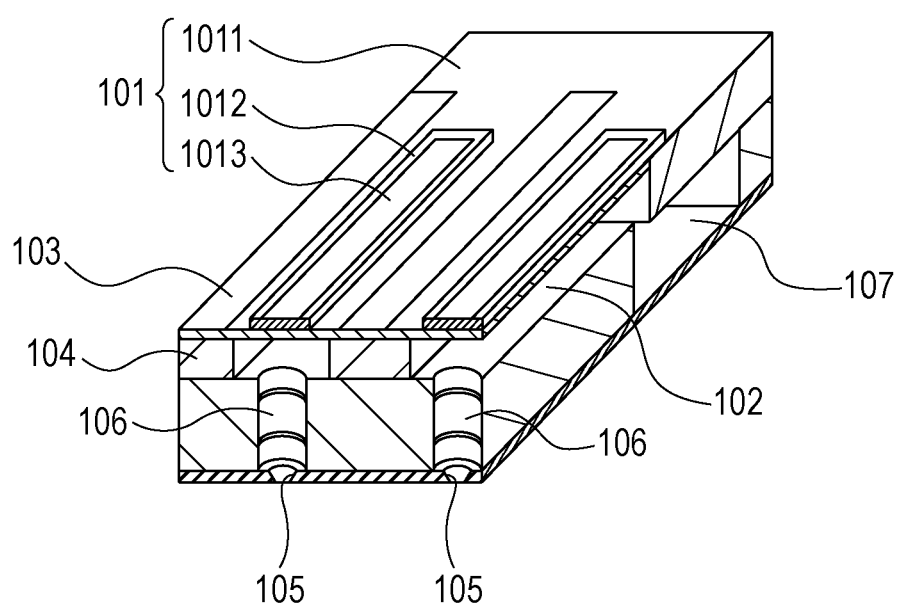

FIG. 3A and FIG. 3B are schematic diagrams showing one example of a liquid discharge head according to an embodiment of the present invention. The liquid discharge head includes a piezoelectric element 101. The piezoelectric element 101 includes a first electrode 1011, a piezoelectric material 1012, and a second electrode 1013. The piezoelectric material 1012 is patterned according to need as shown in FIG. 3B.

FIG. 3B is a schematic diagram of the liquid discharge head. The liquid discharge head includes discharge ports 105, individual liquid chambers 102, connecting holes 106 connecting the individual liquid chambers 102 to the discharge ports 105, liquid chamber walls 104, a common liquid chamber 107, a vibrating plate 103, and the piezoelectric element 101. Although the piezoelectric element 101 in the drawing has a rectangular shape, it may have any other shape, such as elliptical, circular, rectangular parallelepiped, etc. In general, the piezoelectric material 1012 has a shape corresponding to the shape of the individual liquid chambers 102.

The piezoelectric element 101 of the liquid discharge head and nearby parts will now be described in detail with reference to FIG. 3A. FIG. 3A is a cross-sectional view of the piezoelectric element taken in the width direction of the liquid discharge head shown in FIG. 3B. Although the cross-sectional shape of the piezoelectric device 101 is rectangular in this embodiment, the shape may be a trapezoidal or reversed trapezoidal shape.

In the drawing, the first electrode 1011 is used as a lower electrode and the second electrode 1013 is used as an upper electrode. However, arrangement of the first electrode 1011 and the second electrode 1013 is not limited to this. The first electrode 1011 may be used as a lower electrode or an upper electrode. The second electrode 1013 may be used as an upper electrode or a lower electrode. A buffer layer 108 may be interposed between the vibrating plate 103 and the lower electrode.

It should be noted here that these names of the components are determined depending on the process of producing the device and the advantageous effects of the present invention can be achieved in any case. According to this liquid discharge head, the vibrating plate 103 moves up and down by expansion and contraction of the piezoelectric material 1012 and pressure the liquid contained in the individual liquid chambers 102 so that the liquid is discharged from the discharge ports 105. The liquid discharge head can be used in printers and for electronic device production.

The thickness of the vibrating plate 103 is 1.0 µm or more and 15 µm or less and preferably 1.5 µm or more and 8 µm or less. The material for the vibrating plate 103 is not limited but may be silicon. Silicon constituting the vibrating plate may be doped with boron or phosphorus. The buffer layer and the electrode layer on the vibrating plate may form part of the vibrating plate.

The thickness of the buffer layer 108 is 5 nm or more and 300 nm or less and more preferably 10 nm or more and 200 nm or less. The size of the discharge ports 105 is 5 µm or more and 40 µm or less in terms of circular equivalent diameter. The shape of the discharge ports 105 may be circular but may be a star shape, a rectangular shape, or a triangular shape.

Figure 4A:
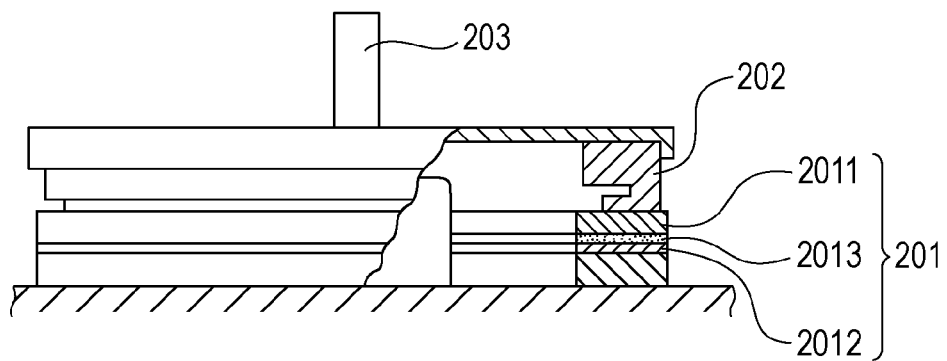
FIG. 4A is a schematic diagram showing an ultrasonic motor according to an embodiment.
Figure 4B:
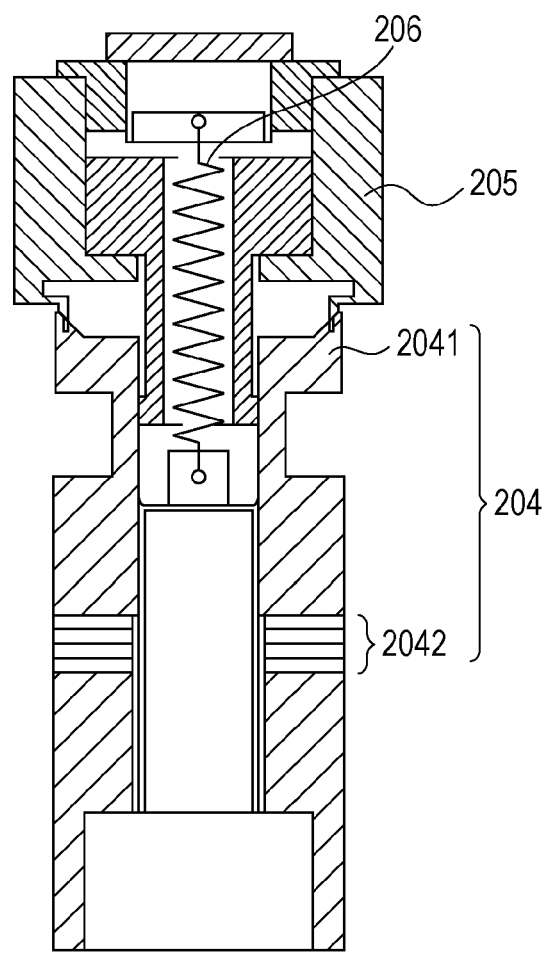
FIG. 4B is a schematic diagram showing an ultrasonic motor according to another embodiment.

Ultrasonic motors using the piezoelectric element will now be described. FIGS. 4A and 4B are schematic views showing examples of embodiments of ultrasonic motors. FIG. 4A shows an ultrasonic motor including a piezoelectric element constituted by a single plate. This ultrasonic motor includes a vibrator 201, a rotor 202 abutting the sliding surface of the vibrator 201 under pressure from a pressurizing spring not shown in the drawing, and an output shaft 203 integrally formed with the rotor 202. The vibrator 201 includes a metal elastic ring 2011, a piezoelectric element 2012, and an organic adhesive 2013 (epoxy- or cyanoacrylate-based adhesive, for example) that bonds the piezoelectric element 2012 to the metal elastic ring 2011. The piezoelectric element 2012 includes a first electrode, a second electrode, and a piezoelectric material interposed between the first and second electrodes (not shown).

When two-phase AC voltage (phase difference: $\pi/2$) is applied to the piezoelectric element, a bending travelling wave occurs in the vibrator 201, and individual points on the sliding surface of the vibrator 201 undergo elliptical motions. When the rotor 202 is pressure-contacted with the sliding surface of the vibrator 201, the rotor 202 receives friction force from the vibrator 201 and rotates in the direction opposite to the bending travelling wave. An object to be driven not shown in the drawing is joined to the output shaft 203 and is driven by the turning force of the rotor 202. When a voltage is applied to the piezoelectric material, the piezoelectric material expands and contracts by a transversal piezoelectric effect. When an elastic body, such as a metal, is in contact with the piezoelectric element, the elastic body is bent by the expansion and contraction of the piezoelectric material. The type of ultrasonic motor described here utilizes this principle.

FIG. 4B shows an example of an ultrasonic motor that includes a piezoelectric element having a multilayer structure. A vibrator 204 includes cylindrical metal elastic bodies 2041 and a multilayer piezoelectric element 2042 interposed between the cylindrical metal elastic bodies 2041. The multilayer piezoelectric element 2042 is an element that includes two or more layers of piezoelectric materials not shown in the drawing and includes a first electrode and a second electrode on the outer surface of the multilayer structure and inner electrodes inside the multilayer structure. The cylindrical metal elastic bodies 2041 are joined with bolts to fix the multilayer piezoelectric element 2042 therebetween to make a vibrator 204.

When alternating current voltages having phases different from each other are applied to the multilayer piezoelectric element 2042, the vibrator 204 excites two vibrations orthogonal to each other. These two vibrations are combined to form circular vibrations for driving at the tip of the vibrator 204. Note that an annular groove is formed in the upper portion of the vibrator 204 to increase the displacement of the vibration for driving.

A rotor 205 pressure-contacts the vibrator 204 due to a spring 206 for pressurization and obtains frictional force for driving. The rotor 205 is rotatably supported by bearings.

Next, a dust cleaning device using a piezoelectric element according to an embodiment of the present invention is described.

Figure 5A:
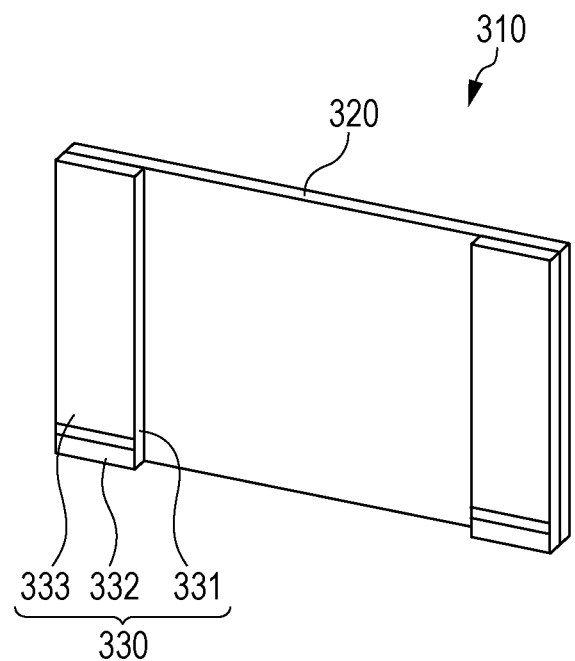
FIGS. 5A and 5B are schematic diagrams showing a dust cleaning device according to an embodiment.
Figure 5B:
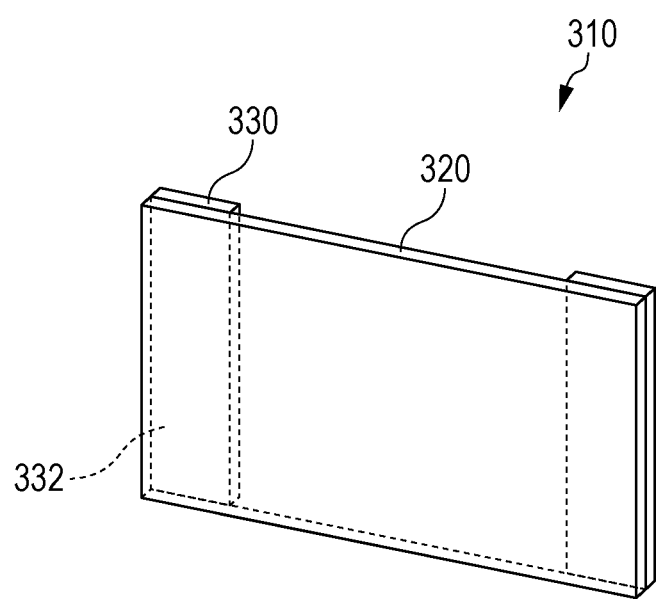

FIGS. 5A and 5B are schematic diagrams showing an embodiment of a dust cleaning device. A dust cleaning device 310 includes a plate-shaped piezoelectric element 330 and a vibrating plate 320. Although the material of the vibrating plate 320 is not limited, a transparent material or a light-reflecting material may be used in the vibrating plate 320 when the dust cleaning device 310 is to be used in optical devices.

The piezoelectric element may be used in a liquid discharge head, an ultrasonic motor, etc., as mentioned above. When the lead-free piezoelectric material containing a tungsten bronze structure metal oxide is used in a liquid discharge head, a nozzle density and discharge force comparable or superior to that of a liquid discharge head that uses a lead-containing piezoelectric material can be achieved. When the lead-free piezoelectric material containing a tungsten bronze structure metal oxide is used in an ultrasonic motor, driving force and durability comparable or superior to that of an ultrasonic motor that uses a lead-containing piezoelectric material can be achieved. When the lead-free piezoelectric material containing a tungsten bronze structure metal oxide is used in a dust cleaning device, a dust cleaning efficiency comparable or superior to that of a dust cleaning device that uses a lead-containing piezoelectric material can be achieved.

The piezoelectric material can also be used in devices other than the liquid discharge head and motor, such as ultrasonic vibrators, piezoelectric actuators, piezoelectric sensors, and ferroelectric memories.

EXAMPLES

The piezoelectric material will now be described in specific detail through examples below. These examples do not limit the scope of the present invention.

Examples 1 to 13

Barium carbonate, bismuth oxide, sodium carbonate, niobium oxide, and tungsten oxide powders were used as the raw materials. The powders were weighed and dry-mixed in a mortar. The mixture was placed in an alumina crucible and calcined in air at 900° C. to 1100° C. for 2 to 5 hours.

A slurry was prepared from the calcined powder. That is, the calcined powder was pulverized, mixed with particular amounts of pure water and a dispersant, and dispersed with a pot mill to obtain a slurry.

A magnetic field was then applied to the slurry to conduct magnetic-field processing. Magnetic field processing was conducted using a superconducting magnetic (JMTD-10T180, produced by Japan Superconductor Technology, Inc.). A 10 T magnetic field was generated by the superconducting magnet, and a table was rotated at 30 rpm in a direction perpendicular to the direction of the magnetic field by using a nonmagnetic ultrasonic motor that can be rotated and driven in magnetic fields. A plaster mold was placed on the table, and the slurry was poured into the plaster mold on the rotating table to conduct slip-cast molding.

The molded body was fired in an electric furnace at 1250° C. to 1330° C. for 6 hours in air. After a surface of the resulting sintered body was cut, structural analysis by X-ray diffraction analysis (XRD) and compositional analysis by X-ray fluorescence analysis were conducted.

Figure 1B:
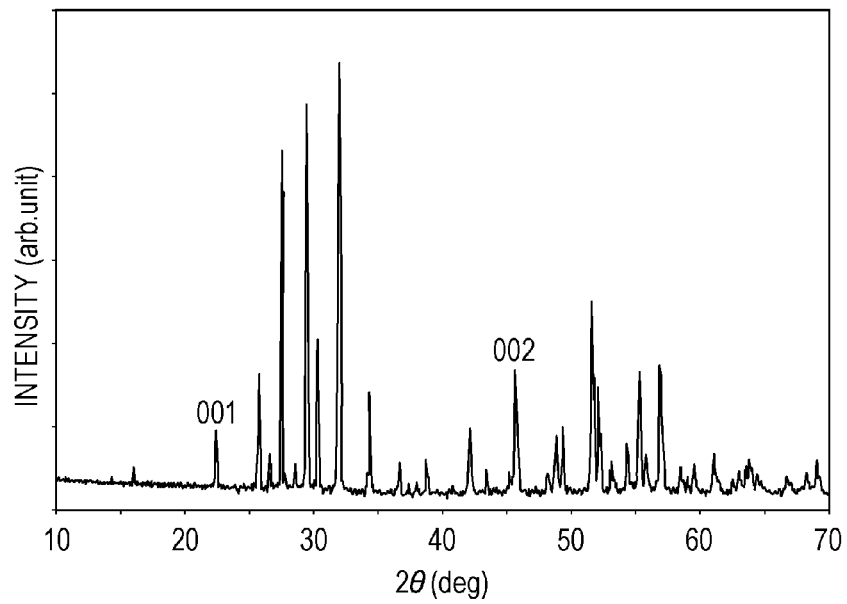

FIGS. 1A and 1B are diagrams observed by 2θ-θ XRD. FIG. 1A is the XRD pattern of a piezoelectric material of Example 10 and FIG. 1B is the XRD pattern of a piezoelectric material of Comparative Example 1. The patterns show that both profiles are that of a tungsten bronze structure metal oxide single phase. The term "single phase" is used when all or nearly all parts of the sintered body are constituted by tungsten bronze structure crystals.

In Example 10 in which the magnetic-field processing is conducted, the intensity of the peak attributable to (001) is high, which indicates that c-axis orientation is achieved. The Lotgering factor F was calculated from the XRD results to evaluate the degree of (001) orientation.

The results of the compositional analysis showed that the piezoelectric material had a tungsten bronze structure represented by $(Ba,Bi,Na)_5Nb_{10}O_{30}$.

The sintered body was polished to a thickness of 1 mm and heat-treated in air at 500° C. to 1000° C. for 1 hour to remove organic matter on the surfaces. Au electrodes 500 μm in thickness were formed by DC-sputtering on both surfaces of the sintered body. The resulting product was cut to 2.5 mm×10 mm by using a cutting machine and used for evaluating various electrical characteristics.

Polarizing was conducted by applying a voltage of 2 to 5 kV/cm for 10 minutes at 120° C. to 200° C. in a silicone oil. The piezoelectric property was evaluated using a $d_{33}$ meter (PiezoMeter System produced by Piezotest).

Table 1 shows the composition, Lotgering factor F, and $d_{33}$ of the piezoelectric materials. In the table, a denotes the ratio Ba/Nb on a molar basis, b denotes the ratio Bi/Nb on a molar basis, c denotes the ratio Na/Nb on a molar basis, and d denotes the ratio Bi/Na on a molar basis. In Table 1, "W parts by weight" indicates the ratio of the weight of metallic tungsten to the total weight of the elements, such as Ba, Bi, Na, and Nb, constituting the tungsten bronze structure on an oxide basis, F denotes the Lotgering factor F indicating the degree of orientation of (001) plane, and $d_{33}$ denotes the piezoelectric constant $d_{33}$.

Comparative Example 1

A slurry was prepared as in Examples 1 to 13.

Then a plaster mold was placed on a table, and slip-cast molding was conducted by pouring the slurry into the plaster mold on the rotating table without conducting magnetic-field processing.

Then a sample of Comparative Example 1 was obtained by sintering as in Examples 1 to 13. The electrical characteristics of the sample of Comparative Example 1 were evaluated as in Examples 1 to 13. The composition, F, and $d_{33}$ of the obtained piezoelectric material are shown in Table 1.

Comparative Examples 2, 3, and 5 to 7

Molded bodies were obtained as in Examples 1 to 13 including performance the magnetic-field processing except that the tungsten oxide powder was not used.

Each molded body was sintered as in Examples 1 to 13 to prepare samples of Comparative Examples 2, 3, and 5 to 7. The electrical characteristics of the samples of Comparative Examples 2, 3, and 5 to 7 were evaluated as in Examples 1 to 13. The composition, F, and $d_{33}$ of the obtained piezoelectric materials are shown in Table 1.

Comparative Example 4

A molded body was obtained as in Examples 1 to 13 including performance of the magnetic-field processing.

The molded body was sintered as in Examples 1 to 13 including performance of the magnetic-field processing to obtain a sample of Comparative Example 4. The electrical characteristics of the sample of Comparative Example 4 were evaluated as in Examples 1 to 13. The composition, F, and $d_{33}$ of the obtained piezoelectric material are shown in Table 1.

Next, Examples 3 to 7 (with magnetic field processing) and Comparative Example 3 (with magnetic field processing) are compared. Samples of Examples 3 to 7 had the same composition except for the W content. Comparison shows that the Lotgering factor F and the piezoelectric constant $d_{33}$ increase with the W content. This result also suggests that incorporation of W increases the Lotgering factor F and the piezoelectric constant $d_{33}$. In a sample having a W content of 3.20 parts by weight, the curie temperature decreased to 70° C. Although this sample was polarized, the piezoelectric constant $d_{33}$ was 40 pC/N and thus was unsatisfactory. Accordingly, when the W content was greater than 3.00 parts by weight, the curie temperature decreases significantly, and the material was not suitable for practical application.

Next, Examples 8 to 10 (with magnetic field processing) and Comparative Example 4 (with magnetic field processing) are compared. All samples had the same composition except for the W content. Comparison shows that the Lotgering factor F and the piezoelectric constant $d_{33}$ increase with the W content. In Comparative Example 4 in which the W content was 0.20 parts by weight, the Lotgering factor F was not significantly different from that of a sample with zero W content.

TABLE 1

| | Composition | | | | | | $d_{33}$ |
|---|---|---|---|---|---|---|---|
| | Ba/Nb = a | Bi/Nb = b | Na/Nb = c | Bi/Na = d | W parts by weight | F | [pC/N] |
| Example 1 | 0.400 | 0.0500 | 0.0500 | 1.00 | 1.20 | 0.78 | 71.2 |
| Example 2 | 0.385 | 0.0575 | 0.0575 | 1.00 | 0.40 | 0.56 | 73.1 |
| Example 3 | 0.385 | 0.0575 | 0.0575 | 1.00 | 0.80 | 0.78 | 88.9 |
| Example 4 | 0.385 | 0.0575 | 0.0575 | 1.00 | 1.20 | 0.81 | 100 |
| Example 5 | 0.385 | 0.0575 | 0.0575 | 1.00 | 1.60 | 0.86 | 105 |
| Example 6 | 0.385 | 0.0575 | 0.0575 | 1.00 | 2.00 | 0.92 | 152 |
| Example 7 | 0.385 | 0.0575 | 0.0575 | 1.00 | 2.40 | 0.99 | 166 |
| Example 8 | 0.375 | 0.0625 | 0.0625 | 1.00 | 0.40 | 0.60 | 74.1 |
| Example 9 | 0.375 | 0.0625 | 0.0625 | 1.00 | 1.20 | 0.90 | 139 |
| Example 10 | 0.375 | 0.0625 | 0.0625 | 1.00 | 1.60 | 0.97 | 180 |
| Example 11 | 0.375 | 0.0655 | 0.0595 | 1.10 | 1.20 | 0.77 | 110 |
| Example 12 | 0.375 | 0.0592 | 0.0658 | 0.90 | 1.20 | 0.81 | 108 |
| Example 13 | 0.350 | 0.0750 | 0.0750 | 1.00 | 1.20 | 0.85 | 150 |
| Comparative Example 1 | 0.375 | 0.0625 | 0.0625 | 1.00 | 1.60 | 0.00 | 35.9 |
| Comparative Example 2 | 0.400 | 0.0500 | 0.0500 | 1.00 | 0.00 | 0.39 | 44.7 |
| Comparative Example 3 | 0.385 | 0.0575 | 0.0575 | 1.00 | 0.00 | 0.46 | 56.8 |
| Comparative Example 4 | 0.375 | 0.0625 | 0.0625 | 1.00 | 0.20 | 0.50 | 60.8 |
| Comparative Example 5 | 0.375 | 0.0655 | 0.0595 | 1.10 | 0.00 | 0.44 | 55.2 |
| Comparative Example 6 | 0.375 | 0.0592 | 0.0658 | 0.90 | 0.00 | 0.41 | 57.6 |
| Comparative Example 7 | 0.350 | 0.0750 | 0.0750 | 1.00 | 0.00 | 0.40 | 65.8 |

Comparison of Example 10 (with magnetic-field processing) and Comparative Example 1 (without magnetic-field processing) having the same composition and the same W content shows that the piezoelectric constant $d_{33}$ of Example 10 is significantly increased by conducting the magnetic orientation.

Comparison of Example 1 (with magnetic-field processing) having a W content of 1.20 parts by weight and Comparative Example 2 (with magnetic field processing) containing no W shows that the Lotgering factor F and the piezoelectric constant $d_{33}$ of the Example 1 are improved. This result suggests that incorporation of W increases the Lotgering factor F and the piezoelectric constant $d_{33}$ when magnetic-field processing is conducted.

These results suggest that the W content may be 0.40 to 3.00 parts by weight.

Lastly, Example 11 (with magnetic field processing), Comparative Example 5 (with magnetic field processing), and Example 12 (with magnetic field processing) and Comparative Example 6 (with magnetic field processing) are compared. In these samples, the Bi/Na ratio d on a molar basis is deviated from 1.00. The result suggests that incorporation of W increases the Lotgering factor F and the piezoelectric constant $d_{33}$.

In view of the above, Table 1 suggests that when W is added to the material system containing Ba, Bi, Na, and Nb, the Lotgering factor F and the piezoelectric constant $d_{33}$ are increased.

Examples 14 to 17

Piezoelectric materials of these examples differ from the piezoelectric materials mentioned above in that manganese (Mn) is further added. Barium carbonate, bismuth oxide, sodium carbonate, niobium oxide, manganese oxide, and tungsten oxide powders were used as the raw materials. The powders were weighed and dry-mixed in a mortar. The mixture was then placed in an alumina crucible and calcined at 900° C. to 1100° C. for 2 to 5 hours in air.

Slurries were prepared and molded as in Examples 1 to 13 including performance of magnetic field processing.

The resulting molded bodies were fired in an electric furnace at 1250° C. to 1330° C. for 6 hours in air. The structural and compositional analyses and evaluation of electrical characteristics were carried out as in Examples 1 to 13.

The results of the compositional analysis showed that the obtained piezoelectric materials had a tungsten bronze structure represented by $(Ba,Bi,Na)_5Nb_{10}O_{30}$.

Table 2 shows the composition, F, and $d_{33}$ of the obtained piezoelectric materials. In the table, a denotes the ratio Ba/Nb on a molar basis, b denotes the ratio Bi/Nb on a molar basis, c denotes the ratio Na/Nb on a molar basis, and d denotes the ratio Bi/Na on a molar basis. The phrase "W parts by weight" indicates the ratio of the weight of metallic tungsten to the total weight of the elements, such as Ba, Bi, Na, and Nb, constituting the tungsten bronze structure on an oxide basis, and "Mn parts by weight" indicate the ratio of the weight of metallic manganese to the total weight of the elements, such as Ba, Bi, Na, and Nb, constituting the tungsten bronze structure on an oxide basis. F denotes the Lotgering factor F indicating the degree of orientation of (001) plane, and $d_{33}$ denotes the piezoelectric constant $d_{33}$.

Comparative Examples 8 to 10

Molded bodies were obtained as in Examples 14 to 17 including the performance of the magnetic field processing except that the tungsten oxide powder was not used.

The molded bodies were sintered as in Examples 14 to 17 to obtain samples of Comparative Examples 8 to 10. The electrical characteristics of the samples of Comparative Examples 8 to 10 were evaluated as in Examples 14 to 17. The composition, F, and $d_{33}$ of the obtained piezoelectric materials are shown in Table 2.

First, Examples 15 and 16 and Comparative Example 9 are compared. These samples had the same composition except for the W content. Comparison shows that the Lotgering factor F and the piezoelectric constant $d_{33}$ of Examples 15 and 16 increase with the W content. The same tendency was observed by comparing Example 14 to Comparative Example 8 and Example 17 to Comparative Example 10. These results suggest that incorporation of W increases the Lotgering factor F and the piezoelectric constant $d_{33}$ also in the material system containing Ba, Bi, Na, Nb, and Mn.

Next, Examples 14, 16, and 17 are compared. These samples had the same composition except for the Mn content. Comparison shows that the Lotgering factor F increases with the Mn content. In contrast, the piezoelectric constant $d_{33}$ does not increase monotonically. These results suggest that incorporation of Mn is effective when the Mn content is within the range of 0.16 to 0.48 parts by weight and more preferably within the range of 0.16 to 0.32 parts by weight. The mechanical quality factors of all samples of Examples 14 to 17 and Comparative Examples 8 to 10 were 500 or higher. The mechanical quality factor of Example 6 not containing Mn is 278. This shows that the material system containing Mn has a higher mechanical quality factor than the material system that contains no Mn.

Examples 18 to 22

Barium carbonate, strontium carbonate, bismuth oxide, sodium carbonate, niobium oxide, and tungsten oxide powders were used as the raw materials. The powders were weighed and dry-mixed in a mortar. The mixture was then placed in an alumina crucible and calcined at 900° C. to 1100° C. for 2 to 5 hours in air.

Slurries were prepared and molded as in Examples 1 to 13 including performance of magnetic-field processing.

The molded bodies were fired in an electric furnace at 1250° C. to 1330° C. for 6 hours in air. The structural and compositional analyses and evaluation of electrical characteristics were carried out as in Examples 1 to 13.

The results of the compositional analysis showed that the obtained piezoelectric materials had a tungsten bronze structure represented by $(Ba,Sr,Bi,Na)_5Nb_{10}O_{30}$.

Table 3 shows the composition, F, and $d_{33}$ of the obtained piezoelectric materials. In the table, a denotes the ratio Ba/Nb on a molar basis, b denotes the ratio Bi/Nb on a molar basis, c denotes the ratio Na/Nb on a molar basis, d denotes the ratio Bi/Na on a molar basis, and Sr/Nb denotes the ratio of Sr to Nb on a molar basis. The phrase "W parts by weight" indicates the ratio of the weight of metallic tungsten to the total weight of the elements, such as Ba, Bi, Na, Sr, and Nb, constituting the tungsten bronze structure on an oxide basis. F

TABLE 2

| | Composition | | | | | | | | |
|---|---|---|---|---|---|---|---|---|---|
| | Ba/Nb = a | Bi/Nb = b | Na/Nb = c | Bi/Na = d | W parts by weight | Mn parts by weight | F | $d_{33}$ [pC/N] | Qm* |
| Example 14 | 0.385 | 0.0575 | 0.0575 | 1.00 | 1.60 | 0.16 | 0.82 | 78.2 | 539 |
| Example 15 | 0.385 | 0.0575 | 0.0575 | 1.00 | 1.60 | 0.32 | 0.86 | 90.1 | 327 |
| Example 16 | 0.385 | 0.0575 | 0.0575 | 1.00 | 2.00 | 0.32 | 0.89 | 118 | 556 |
| Example 17 | 0.385 | 0.0575 | 0.0575 | 1.00 | 1.60 | 0.48 | 0.91 | 72.1 | 579 |
| Comparative Example 8 | 0.385 | 0.0575 | 0.0575 | 1.00 | 0.00 | 0.16 | 0.46 | 47.8 | 641 |
| Comparative Example 9 | 0.385 | 0.0575 | 0.0575 | 1.00 | 0.00 | 0.32 | 0.50 | 41.8 | 718 |
| Comparative Example 10 | 0.385 | 0.0575 | 0.0575 | 1.00 | 0.00 | 0.48 | 0.47 | 40.1 | 808 |

Qm: mechanical quality factor denotes the Lotgering factor F indicating the degree of orientation of (001) plane, and $d_{33}$ denotes the piezoelectric constant $d_{33}$. Note that the piezoelectric property was little affected when the value b was slightly low.

Comparative Examples 11 to 14

Molded bodies were obtained as in Examples 18 to 22 including performance of the magnetic field processing except that the tungsten oxide powder was not used.

The molded bodies were sintered as in Examples 18 to 22 to obtain samples of Comparative Examples 11 to 14. The electrical characteristics of the samples of Comparative Examples 11 to 14 were evaluated as in Examples 18 to 21. The composition, F, and $d_{33}$ of the obtained piezoelectric materials are shown in Table 3.

TABLE 3

| | Composition | | | | | | | |
|---|---|---|---|---|---|---|---|---|
| | Ba/Nb = a | Bi/Nb = b | Na/Nb = c | Bi/Na = d | Sr/Nb | W parts by weight | F | $d_{33}$ [pC/N] |
| Example 18 | 0.375 | 0.0500 | 0.0500 | 1.00 | 0.025 | 1.20 | 0.82 | 84.3 |
| Example 19 | 0.375 | 0.0375 | 0.0375 | 1.00 | 0.050 | 1.20 | 0.86 | 83.2 |
| Example 20 | 0.375 | 0.0125 | 0.0125 | 1.00 | 0.100 | 1.20 | 0.85 | 80.1 |
| Example 21 | 0.350 | 0.0125 | 0.0125 | 1.00 | 0.125 | 1.20 | 0.88 | 80.2 |
| Example 22 | 0.300 | 0.0500 | 0.0500 | 1.00 | 0.100 | 0.40 | 0.66 | 71.2 |
| Comparative Example 11 | 0.375 | 0.0500 | 0.0500 | 1.00 | 0.025 | 0.00 | 0.44 | 49.8 |
| Comparative Example 12 | 0.375 | 0.0375 | 0.0375 | 1.00 | 0.050 | 0.00 | 0.47 | 50.7 |
| Comparative Example 13 | 0.375 | 0.0125 | 0.0125 | 1.00 | 0.100 | 0.00 | 0.40 | 52.8 |
| Comparative Example 14 | 0.350 | 0.0125 | 0.0125 | 1.00 | 0.125 | 0.00 | 0.38 | 45.7 |

First, Example 18 and Comparative Example 11 are compared. These samples had the same composition except for the W content. Comparison shows that incorporation of W increases the Lotgering factor F and the piezoelectric constant $d_{33}$. The same tendency was observed in comparison between Example 19 and Comparative Example 12, between Example 20 and Comparative Example 13, and between Example 21 and Comparative Example 14. These results suggest that incorporation of W increases the Lotgering factor F and the piezoelectric constant $d_{33}$ in the material system containing Ba, Bi, Na, Sr, and Nb.

Examples 23 to 26

Barium carbonate, calcium carbonate, bismuth oxide, sodium carbonate, niobium oxide, and tungsten oxide powders were used as the raw materials. The powders were weighed and dry-mixed in a mortar. The mixture was placed in an alumina crucible and calcined at 900° C. to 1100° C. for 2 to 5 hours in air.

Slurries were prepared and molded as in Examples 1 to 13 including performance of magnetic-field processing.

The resulting molded bodies were fired in an electric furnace at 1290° C. to 1350° C. for 6 hours in air. The structural and compositional analyses and evaluation of electrical characteristics were carried out as in Examples 1 to 13.

The results of the compositional analysis showed that the obtained piezoelectric materials had a tungsten bronze structure represented by $(Ba,Ca,Bi,Na)_5Nb_{10}O_{30}$.

Table 4 shows the composition, F, and $d_{33}$ of the obtained piezoelectric materials. In the table, a denotes the ratio Ba/Nb on a molar basis, b denotes the ratio Bi/Nb on a molar basis, c denotes the ratio Na/Nb on a molar basis, d denotes the ratio Bi/Na on a molar basis, and Ca/Nb denotes the ratio of Ca to Nb on a molar basis. The phrase "W parts by weight" indicates the ratio of the weight of metallic tungsten to the total weight of the elements, such as Ba, Bi, Na, Ca, and Nb, constituting the tungsten bronze structure on an oxide basis. F denotes the Lotgering factor F indicating the degree of orientation of (001) plane, and $d_{33}$ denotes the piezoelectric constant $d_{33}$.

Comparative Examples 15 to 18

Molded bodies were obtained as in Examples 23 to 26 including performance of the magnetic field processing except that the tungsten oxide powder was not used.

The molded bodies were sintered as in Examples 23 to 26 to obtain samples of Comparative Examples 15 to 18. The electrical characteristics of the samples of Comparative Examples 15 to 18 were evaluated as in Examples 23 to 26. The composition, F, and $d_{33}$ of the obtained piezoelectric materials are shown in Table 4.

TABLE 4

| | Composition | | | | | | | |
|---|---|---|---|---|---|---|---|---|
| | Ba/Nb = a | Bi/Nb = b | Na/Nb = c | Bi/Na = d | Ca/Nb | W parts by weight | F | $d_{33}$ [pC/N] |
| Example 23 | 0.375 | 0.0500 | 0.0500 | 1.00 | 0.025 | 1.20 | 0.79 | 89.6 |
| Example 24 | 0.375 | 0.0375 | 0.0375 | 1.00 | 0.050 | 1.20 | 0.82 | 83.7 |
| Example 25 | 0.375 | 0.0125 | 0.0125 | 1.00 | 0.100 | 1.20 | 0.80 | 77.8 |

TABLE 4-continued

| | Composition | | | | | | | |
|---|---|---|---|---|---|---|---|---|
| | Ba/Nb = a | Bi/Nb = b | Na/Nb = c | Bi/Na = d | Ca/Nb | W parts by weight | F | $d_{33}$ [pC/N] |
| Example 26 | 0.350 | 0.0125 | 0.0125 | 1.00 | 0.125 | 1.20 | 0.82 | 78.9 |
| Comparative Example 15 | 0.375 | 0.0500 | 0.0500 | 1.00 | 0.025 | 0.00 | 0.27 | 54.1 |
| Comparative Example 16 | 0.375 | 0.0375 | 0.0375 | 1.00 | 0.050 | 0.00 | 0.23 | 54.8 |
| Comparative Example 17 | 0.375 | 0.0125 | 0.0125 | 1.00 | 0.100 | 0.00 | 0.26 | 51.7 |
| Comparative Example 18 | 0.350 | 0.0125 | 0.0125 | 1.00 | 0.125 | 0.00 | 0.30 | 48.1 |

First, Example 23 and Comparative Example 15 are compared. These samples had the same composition except for the W content. Comparison shows that incorporation of W increases the Lotgering factor F and the piezoelectric constant $d_{33}$. The same tendency was observed in comparison between Example 24 and Comparative Example 16, between Example 25 and Comparative Example 17, and between Example 26 and Comparative Example 18. These results suggest that incorporation of W increases the Lotgering factor F and the piezoelectric constant $d_{33}$ in the material system containing Ba, Bi, Na, Ca, and Nb.

Examples 27 to 30

Barium carbonate, bismuth oxide, niobium oxide, and tungsten oxide powders were used as the raw materials. The powders were weighed and dry-mixed in a mortar. The mixture was placed in an alumina crucible and calcined at 900° C. to 1100° C. for 2 to 5 hours in air.

Slurries were prepared and molded as in Examples 1 to 13 including performance of magnetic-field processing.

The resulting molded bodies were fired in an electric furnace at 1290° C. to 1370° C. for 6 hours in air. The structural and compositional analyses and evaluation of electrical characteristics were carried out as in Examples 1 to 13.

The results of the compositional analysis showed that the obtained piezoelectric materials had a tungsten bronze structure represented by $(Ba,Bi)_5Nb_{10}O_{30}$.

Table 5 shows the composition, F, and $d_{33}$ of the obtained piezoelectric materials. In the table, a denotes the ratio Ba/Nb on a molar basis, and b denotes the ratio Bi/Nb on a molar basis. The phrase "W parts by weight" indicates the ratio of the weight of metallic tungsten to the total weight of the elements, such as Ba, Bi, and Nb, constituting the tungsten bronze structure on an oxide basis. F denotes the Lotgering factor F indicating the degree of orientation of (001) plane, and $d_{33}$ denotes the piezoelectric constant $d_{33}$.

Comparative Examples 19 and 20

Molded bodies were obtained as in Examples 27 and 28 including performance of the magnetic field processing except that the tungsten oxide powder was not used.

The molded bodies were sintered as in Examples 27 to 30 to obtain samples of Comparative Examples 19 and 20. The electrical characteristics of the samples of Comparative Examples 19 and 20 were evaluated as in Examples 27 to 30. The composition, F, and $d_{33}$ of the obtained piezoelectric materials are shown in Table 5.

TABLE 5

| | Composition | | | | |
|---|---|---|---|---|---|
| | Ba/Nb = a | Bi/Nb = b | W parts by weight | F | $d_{33}$ [pC/N] |
| Example 27 | 0.400 | 0.0667 | 1.20 | 0.91 | 71.1 |
| Example 28 | 0.375 | 0.0833 | 1.20 | 0.91 | 83.3 |
| Example 29 | 0.375 | 0.0833 | 0.40 | 0.77 | 75.1 |
| Example 30 | 0.375 | 0.0833 | 2.40 | 0.93 | 85.2 |
| Comparative Example 19 | 0.400 | 0.0667 | 0.00 | 0.44 | 46.9 |
| Comparative Example 20 | 0.375 | 0.0833 | 0.00 | 0.46 | 62.1 |

First, Example 27 and Comparative Example 19 are compared. These samples had the same composition except for the W content. Comparison shows that incorporation of W increases the Lotgering factor F and the piezoelectric constant $d_{33}$. The same tendency was observed in comparison between Example 28 and Comparative Example 20. These results suggest that incorporation of W increases the Lotgering factor F and the piezoelectric constant $d_{33}$ in the material system containing Ba, Bi, and Nb.

The composition of Ba, Bi, and Nb in the samples of Examples 27 to 30 expressed by $(Ba_{1-x},Bi_{2x/3})_5Nb_{10}O_{30}$ is x=0.20 or 0.25. This suggests that the ratio x of Ba and Bi may be $0.20 \leq x \leq 0.25$.

Tables 1 to 5 suggest that the piezoelectric materials of Examples have high Lotgering factor F and piezoelectric constant $d_{33}$ and thus have superior piezoelectric property to piezoelectric materials of Comparative Examples.

Liquid Discharge Head, Ultrasonic Motor, and Dust Cleaning Device that Use Piezoelectric Materials of Examples 10 and 16

A liquid discharge head shown in FIGS. 3A and 3B, ultrasonic motors shown in FIGS. 4A and 4B, and a dust cleaning device shown in FIGS. 5A and 5B were fabricated using the piezoelectric materials of Example 10 and Example 16. It was confirmed that ink was discharged from the liquid discharge head according to an input electrical signal and that the ultrasonic motors were rotated by application of alternating voltage. A good dust cleaning rate was observed when plastic beads were spread onto the surface of the dust cleaning device by application of alternating voltage.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-133291, filed Jun. 10, 2010, and No. 2011-115837, filed May 24, 2011, which are hereby incorporated by reference herein in their entirety.

INDUSTRIAL APPLICABILITY

The present invention provides a piezoelectric material containing no components harmful to environment and having high piezoelectricity. The present invention also provides a piezoelectric element, a liquid discharge head, an ultrasonic motor, and a dust cleaning device that use the piezoelectric material.

REFERENCE SIGNS LIST 101 piezoelectric element
102 individual liquid chamber
103 vibrating plate
104 liquid chamber wall
105 discharge port
106 connecting hole
107 common liquid chamber
108 buffer layer
1011 first electrode
1012 piezoelectric material
1013 second electrode
201 vibrator
202 rotor
203 output shaft
204 vibrator
205 rotor
206 spring
2011 elastic ring
2012 piezoelectric element
2013 organic adhesive
2041 metal elastic body
2042 multilayer piezoelectric element
310 dust cleaning device
330 piezoelectric element
320 vibrating plate

The invention claimed is:

1. A piezoelectric material comprising:
a tungsten bronze structure metal oxide that includes metal elements which are barium, bismuth, and niobium; and tungsten,
wherein
the metal elements satisfy following conditions on a molar basis:

when Ba/Nb=$a$, $0.30 \le a \le 0.40$, and when Bi/Nb=$b$, $0.012 \le b \le 0.084$;

a tungsten content on a metal basis is 0.40 to 3.00 parts by weight relative to 100 parts by weight of the tungsten bronze structure metal oxide; and
the tungsten bronze structure metal oxide has a c-axis orientation.

2. The piezoelectric material according to claim 1, wherein the piezoelectric material has a Lotgering factor F of 0.56 or more and 1.00 or less, where the Lotgering factor F indicates the degree of c-axis orientation determined by X-ray diffraction analysis.

3. The piezoelectric material according to claim 1, wherein the tungsten bronze structure metal oxide includes metal elements which are barium, bismuth, niobium, and sodium, and
the metal elements satisfy following conditions on a molar basis:

when Na/Nb=$c$, $0.012 \le c \le 0.075$, and when Bi/Na=$d$, $0.90 \le d \le 1.1$.

4. The piezoelectric material according to claim 3, wherein the tungsten bronze structure metal oxide is represented by $(Ba_e,Ca_f,Bi_g,Na_h)_5Nb_{10}O_{30}$ ($0.60 \le e \le 0.80$, $0 \le f \le 0.25$, $0.012 \le g \le 0.15$, $0.012 \le h \le 0.15$, and $e+f+g+h=1.00$).

5. The piezoelectric material according to claim 1, wherein the tungsten bronze structure metal oxide is represented by $(Ba_{1-x},Bi_{2x/3})_5Nb_{10}O_{30}$ ($0.20 \le x \le 0.25$).

6. The piezoelectric material according to claim 1, wherein the piezoelectric material further comprises manganese, and a manganese content on a metal basis is 0.16 to 0.48 parts by weight relative to 100 parts by weight of the tungsten bronze structure metal oxide.

7. A piezoelectric element comprising:
a first electrode;
a piezoelectric material; and
a second electrode,
wherein the piezoelectric material is the piezoelectric material according to claim 1.

8. A liquid discharge head comprising:
the piezoelectric element according to claim 7.

9. An ultrasonic motor comprising:
the piezoelectric element according to claim 7.

10. A dust cleaning device comprising:
the piezoelectric element according to claim 7.

11. A ferroelectric memory comprising:
the piezoelectric element according to claim 7

12. An optical device comprising:
the dust cleaning device according to claim 10.

13. A piezoelectric sensor comprising:
the piezoelectric element according to claim 7.

* * * * *